United States Patent [19]

Kaufman et al.

[11] Patent Number: 4,908,573

[45] Date of Patent: Mar. 13, 1990

[54] 3D IMAGE RECONSTRUCTION METHOD FOR PLACING 3D STRUCTURE WITHIN COMMON OBLIQUE OR CONTOURED SLICE-VOLUME WITHOUT LOSS OF VOLUME RESOLUTION

[75] Inventors: Leon Kaufman, San Francisco; David M. Kramer, San Rafel; Ricardo Guzman, San Francisco, all of Calif.

[73] Assignee: The Regents of the University of California, Berkeley, Calif.

[21] Appl. No.: 293,859

[22] Filed: Jan. 5, 1989

[51] Int. Cl.[4] .............................................. G01R 33/20
[52] U.S. Cl. ..................................... 324/309; 382/41
[58] Field of Search ............... 324/309, 307; 128/653; 382/43, 44, 45, 49, 41

[56] References Cited

U.S. PATENT DOCUMENTS

| 4,710,716 | 12/1987 | Keren et al. | 324/309 |
| 4,751,660 | 6/1988 | Hedley | 382/44 |
| 4,841,247 | 6/1989 | Itagaki | 324/309 |

OTHER PUBLICATIONS

"An Improved Spectroscopic Imaging (SI)... and ISIS in Human Organs", Twieg, Meyerhoff, Gober, Boska, Hubesch, Schaefer, Roth, Sappey-Marinier and Weiner; Society of Magnetic Resonance in Medicine, 7th Annual Meeting, 20–26, Aug. 1988, p. 710, vol. 2, San Francisco, CA.

"NMR Volume Imaging With Half Slice Offsets", Mark C. Leifer, Brian P. Wilfrey; Book of Abstracts, Society of Magnetic Resonance in Medicine, 4th Annual Mtg. 19–23, Aug. 1985, pp. 1013–1014, vol. 1, London, United Kingdom.

"On the Comparison of Interpolation Methods", Einar Maeland, Seismological Observatory, University of Bergen, Bergen, Norway, IEEE Log No. 8822352 IEEE Medical Imaging, vol. 7, No. 3, Sep. 1988.

*Primary Examiner*—Hezron E. Williams
*Assistant Examiner*—Louis M. Arana
*Attorney, Agent, or Firm*—Nixon & Vanderhye

[57] ABSTRACT

Variable voxel shifts required for shifting a 3D structure into a common oblique or contoured slice volume based on an existing 3D image are achieved by effecting variable f(x,y) phase shifts in corresponding frequency domain data parallel to a selected axis dimension and then reconstructing a new three-dimensional image having the 3D structure all located within a common oblique or otherwise contoured slice volume such that it may viewed in a single planar image display without loss of volume resolution. Equivalent convolution processes withing the spatial domain may also be empolyed. Oblique or curved reconstructions can thus be made using either originally acquired frequency domain data (used to construct the original image) or frequency domain data obtained by inverse Fourier transforming the available spatial domain data of the images themselves.

20 Claims, 5 Drawing Sheets

3D IMAGE RECONSTRUCTION METHOD FOR PLACING 3D STRUCTURE WITHIN COMMON OBLIQUE OR CONTOURED SLICE-VOLUME WITHOUT LOSS OF VOLUME RESOLUTION

This invention generally deals with three-dimensional image processing. More particularly, it deals with method and apparatus for reconstructing an existing three dimensional image so that a three-dimensional structure passing through plural slice-volumes of the original image can be shifted into a common slice or contour-volume without loss of volume resolution. The invention has particular (but not exclusive) application for processing three-dimensional images obtained by magnetic resonance imaging (MRI).

MRI is now in widespread commercial usage. Some examples of prior art MRI methods and apparatus including methods for three-dimensional image construction may be found, for example, in prior issued commonly assigned U.S. Pat. Nos. 4,297,637; 4,318,043; 4,471,305; and 4,599,565. The contents of these referenced related patents are hereby incorporated by reference.

A is already well-known in the art, a three-dimensional MRI data set may be created in a number of ways. For example, nuclear magnetic resonance RF data may be elicited from a plurality of parallel contiguous slice-volumes and phase encoded in two different dimensions (e.g., x,y) so that the NMR hydrogen (or other NMR sensitive nuclear) density may be calculated for each volume element (voxel) within a given slice-volume using two-dimensional Fourier transform techniques. Another known technique obtains nuclear magnetic resonance RF data from an entire three-dimensional volume including phase encoding in three dimensions (e.g., x,y,z) which then produces similar voxel values for plural substantially parallel and contiguous slice-volumes after three dimensions of Fourier transformation.

As will be appreciated by those in the art, prior to Fourier transformation from the frequency domain to the spatial domain in which the array of voxel values are displayed (e.g., typically with grey or other color values corresponding to density data for the voxel in a regular rectangular array on a CRT display, film or the like), the data in at least one of the x,y,z dimensions exists in the frequency domain.

Regardless of how a three-dimensional image (i.e., comprising a three-dimensional array of contiguous voxels, each having a numerical value representing NMR signal intensity therein) is originally constructed, it is always possible to perform one or more inverse Fourier transforms upon such spatial domain data so as to derive corresponding frequency domain data for one or all of the common x,y,z three-dimensional coordinate axes.

For various reasons, the voxels of any such three-dimensional array in the spatial domain may turn out to be in less than optimum positions. Thus, in the past, attempts have been made to interpolate between the original three-dimensional voxels so as to create a new slice-volume of voxels which can be displayed as a planar image for viewing purposes but located differently within the three-dimensional volume.

For example, there are existing methods used with images formed by X-ray computed tomography and/or MRI data which are applicable to any tomographic technique which produces a three-dimensional array of image voxels arranged in more than one slice-volume. In general, these existing methods depend upon assumptions as to how the spatial domain image data would change at specific sample locations disposed between existing sample locations represented by existing voxel centers. Typically, for example, it is assumed that the spatial domain voxel values change linearly between the centers of adjacent original voxels.

In any event, all existing spatial domain interpolation techniques necessarily generate a guess or estimate of data values located between calculated voxel values of an existing original image. The linear fit "guess" represents the assumed signal intensity at a point located half-way between the centers of existing voxels to be simply the average of those two adjoining voxels. Notice, however, that such an average value is the same as would be obtained if one processed the data so as to show slice-volumes having twice as much thickness (except for a scale factor which applies to all voxels in the image and is therefore inconsequential).

Accordingly, using a linear spatial domain estimation, shifting the voxels within a given slice-volume image by one-half section thickness actually results in an image of a slice-volume having twice the thickness? In general, whenever such interpolation techniques are used in the spatial domain to achieve shifting of images (whether at an oblique angle or at a right-angle such as to shift an entire slice-volume parallel to itself) the process entails a loss of volume resolution since data from adjacent voxels is necessarily used (and regardless of whether a linear or other kernel such as cubic is used in the spatial domain interpolation process).

As a more graphical representation of the loss of volume resolution using conventional interpolation methods, reference is made to FIGS. 3-6 of:

Maeland, "On The Comparison of Interpolation Methods," IEEE - Trans. Med. Imag., Vol 7 pages 213-216 (1988).

In FIGS. 4 and 6, Maeland depicts the spectra of linear and various cubic interpolations. These plots show that half of the information at the Nyquist frequency (0.5 Hz) is lost and that there is loss of information at spatial frequencies between 0.25 and 0.5 Hz. The spectrum of the Fourier shift corresponds to the rectangle shown for reference purposes in the same figures (i.e., constant value at 1.0 from 0 to 0.5 Hz and constant value at 0.0 from 0.5 Hz and constant value at 0.0 from 0.5 Hz to 1.0 Hz). The figure analogous to FIG. 5 would show a sinc function with zero crossings at $\pm 1$, $\pm 2$, $\pm 3$ . . . .

However, when one considers the above-mentioned 3D FT imaging processes, it will be appreciated that data are acquired from the whole volume to be imaged with slice-volumes being phase encoded so as to permit eventual segregation into plural contiguous parallel slice-volumes by a final dimension of Fourier transformation along the slice direction (e.g., the z-axis typically). Basically, a pseudo-echo of MRI "data" is formed along this (z) axis and reconstruction via Fourier transformation of this pseudo-echo on a voxel-by-voxel basis then produces slice-axis (e.g., z-axis) information.

Therefore, it follows that if phase modulation is introduced into the data prior to the final reconstruction step (i.e., prior to the final Fourier transformation step), then the resulting three-dimensional image of the object is shifted in the resulting spatial domain. Such phase shifting can be effected as a part of the reconstruction process by using the Fourier transform of a spatial domain delta function offset by the desired amount, and the offset can be quite small such as, for example, 1/256th of the spatial dimension between adjacent voxel centers. Subsequent conventional Fourier reconstruction of the thus phase shifted frequency domain data then yields a resulting image shifted along the corresponding axis (e.g., the z-axis if z-axis phase shift is introduced in the frequency domain).

Others have already recognized that it is possible to use suitable phase shifts in the frequency domain so as to effect spatial translational shifting of the voxel matrix array in the resulting three-dimensional image.

For example, Leifer et al ("NMR Volume Imaging with Half Slice Offsets", Soc. Mag. Res. Med., Book of Abstracts, 4th Annual Meeting, Aug. 19–23, 1985, Volume 1, pp 1013–1014). Leifer et al were employed by a common licensee (i.e., Diasonics MRI. Inc.) of the present application. In this prior art publication, Leifer et al recognized that when 3DFT image construction is utilized, MRI data are acquired with N values of phase encoding gradient along the slice-defining direction (e.g., z-axis). Translational offsets in the spatial domain could be achieved using complex spatial domain post-processing interpolation or by merely moving the subject within the gradient coil set and repeating the acquisition of original MRI image data. However, Leifer et al also recognized that they could introduce a constant phase shift in the z-dimension phase encoded data so as to produce spatial domain spectral coefficients located between those of the conventional third dimension of Fourier transformation To effect the necessary phase shifts so as to result in exactly one-half slice thickness translational offset, they proposed transforming the initial N data sets x(n) for according to the following formula:

$$X(k) = \sum_{n=0}^{N-1} x(n) \exp\frac{-2\pi jnk}{N} \exp\frac{-\pi jn}{N} \quad k = 0,1 \ldots N-1 \quad \text{[Equation 1]}$$

Leifer et al also recognized that it should be possible to make the translational offset an arbitrary fraction of a slice-volume thickness. They noted experimental results at that time acquired with a Diasonics MT/s imager at 0:35 Tesla showing that the offset slices obtained with this technique have definition and clarity identical to the standard slices, with no significant increase in processing time and that such technique is rapid since it requires neither interpolation nor rescanning of the patient—and that it provided results of equal precision to that of the original since all of the information present in the original image is retained and used in the shifted reconstruction.

Leifer et al also noted that their technique could be applied retroactively to any volume image data set (e.g., by using inverse Fourier transforms on spatial domain three-dimensional images with respect to the axis direction along which shifting is desired).

Another group of individuals independently working with applicant's licensee (Diasonics MRI, Inc.) has also discovered that such phase shifting in the frequency domain may be utilized to shift the voxels in magnetic resonance spectroscopic images so as—to translate them in the x and y dimensions as well as the z or slice direction. This work by Derby et al was performed prior to our work and may be the subject of a subsequent separate patent application.

Derby et al first consider a one dimensional object, described by a density function p(x), and imaged by N steps of phase encoding. They let the field of view be $\delta$ and denote the usual finite Fourier transform representation of p(x) by f(x) where f is merely the convolution of p with the appropriate finite Fourier kernel, and is customarily evaluated at grid points $x_k = k/N$, with k running from $-N/2$ to $N/2-1$, They then write $f(x_k)$ as f(k), given by $$f(k) = \Sigma F_n \exp(2\pi i k/n/N) \quad \text{[Equation 2]}$$

where $F_n$ = is the Fourier coefficient:

$$F_n = \pi f(x)\exp-(2\pi inx/\lambda)dx \quad \text{[Equation 3]}$$

and the sum in Equation 2 is from $-N/2$ to $N/2-1$.

Derby et al evaluate f at a location not on the grid defined by the $x_k$, by considering a point lying between $x_k$ and $x_{k+1}$. They denote the fractional displacement by $\delta$, where $|\delta| = 1$ represents a shift of one voxel. Then they note that the shifted position coordinate is given by $(k+\delta)/N$, leading to $$f(k+\delta) = \Sigma F_n \exp[2\pi i(k+\delta)n/N] \quad \text{[Equation 4]}$$

which may be re-written as $$f(k+\delta) = \Sigma F'_n \exp[2\pi i\, kn/N] \quad \text{[Equation 5]}$$

where $$F'_n = F_n \exp[2\pi i\, \delta n/N]. \quad \text{[Equation 6]}$$

Derby et al then note that Equations 5 and 6 are nothing more than an expression of the Shift Theorem for finite Fourier transforms. They then reflect that $\delta$ may be positive or negative, and may be greater than 1, indicating shifts of more than one voxel and that voxel shifts may therefore be accomplished computationally by minimal manipulation of the $F_n$, which constitute the raw data.

Derby et al also note that such voxel shifting can be extended to planar images produced using only with two dimensions of phase encoding and to phase encoded spectroscopic images, which are acquired with two dimensions of phase encoding plus a sampling period of free precession in a homogeneous field, and processed by Fourier transformation with respect to the two encoding gradients and time. ("Free precession" refers to removal of the RF magnetic field.) As is known in the art, this produces an array of spectra, each assignable to a specific voxel location in space.

Derby et al describe translational voxel shifting in spectroscopic imaging to be useful where it is often desired to view the spectrum of a lesion which may overlap the boundaries of two or more voxels, if calculated with respect to the usual grid points. Since the overlap essentially dilutes the spectrum of the lesion with those of the normal surrounding tissue, the unique features of the lesion spectrum may be lost. Voxel shifting enables one to obtain the clearest possible view of lesion spectra in a spectroscopic image by translating the voxel grid in three dimensions so as to maximally encompass the lesion.

Derby et al therefore have discovered a method for translationally shifting the voxel boundaries of spectra obtained by spectroscopic imaging by use of the Shift Theorem for Fourier transforms, applied a posteriori to the usual spectroscopic data set.

Messrs. Twieg et al ("An Improved Spectroscopic Imaging (SI) Technique for Localized Phosphorus NMR Spectroscopy; Direct Comparison of SI and ISIS in Human Organs," Soc. Mag. Res. Med , 7th Annual Meeting, Aug. 20–26, 1988, Vol. 2) also mentioned that "spectra can be reconstructed from any number of individual volumes of interest (VOIs), at locations chosen after data acquisition." However, Twieg et al do not give any information at all as to how this process is to be effected (e.g., whether by various spatial domain interpolation techniques or frequency domain phase shifts, or some method distinct from either of these).

While the above-described usages of the Fourier transform Shift Theorem to effect spatial domain movements of the voxel grid work have thus been proposed by others for translationally shifting the entire matrix of voxels rectilinearly along x,y,z-axes, we have now recognized that the Shift Theorem also provides a basis for totally reconstructing an image of complex three-dimensional structures passing through plural slice-volumes of such three-dimensional images into a common single slice-volume (which may or may not have a generally planar configuration) so that a greater portion of the structure can be viewed simultaneously in a single planar image.

In brief, we have recognized that the phase shift introduced in the frequency domain may be made on a voxel-by-voxel basis so as to achieve different spatial shifts from one voxel to the next (e.g., as a function of x,y within each z plane).

For example, to produce an oblique slice-volume section (i.e., so as to cause the reconstructed slice-volumes to be oriented obliquely with respect to the original image slice-volume), each voxel within existing slice-volume data sets is shifted differently (e.g., as a linear function of displacement along some desired axis orientation). In this manner, the resulting reconstituted image can have its slice-volumes oriented at any desired orientation without any loss of volume resolution whatsoever (i.e., because all of the available data is utilized in the reconstruction).

Such variable phase shifts can also be used selectively so as to bring a curved complexly oriented structure passing through plural slice-volumes of the original image into a single reconstructed slice-volume. Here, the necessary voxel-by-voxel phase shifts throughout the three-dimensional image volume may be determined manually or by a best fit high order polynomial function (e.g., best fit to selected separated points along the structure to be conformed into a single image plane) or by other techniques rather than by a simple linear function as used to obtain oblique orientation of planar slice-volumes.

The phase shifts in the frequency domain may produce aliasing along the shifted direction. However, such aliasing should be exactly equal to the number of voxels shifted and thus can be easily compensated by a simple rearrangement of data in a computer process/display memory prior to further processing and display.

Using the Shift Theorem in this manner, the voxel dimensions from which raw data contributes to any one final image voxel is unchanged from that where the normal 3DFT transform is performed on the original data (i.e., without post processing phase shifts in the frequency domain). Therefore, volume resolution in the shifted spatial domain is not impaired (as it is with spatial domain interpolation processes more typically used in the past).

Although the process described above is most easily performed on original data sets used with 3DFT image construction algorithms, it is also possible to perform the same sort of phase shift frequency domain operations on images obtained by 2D FT techniques. For example, an inverse Fourier transform may be effected along the desired spatial domain axis (e.g., along the z-axis dimension perpendicular to the typical slice-volumes) so as to create suitable frequency domain pseudo-data upon which the necessary phase shifts can be effected followed by suitable forward Fourier transform reconstruction so as to reconstruct the desired image in the spatial domain having the requisite shifted location of image voxels.

However, when thus applied to a generalized 3D image data set not produced by Fourier Transformation, the Fourier Shift algorithm will introduce some artifacts due to the finite sampling. The corresponding sinc function interpolation (convolution kernel) does not have very rapid convergence. If there are less than sixteen points in the Fourier Transformation, aliasing can be severe. And, each of the newly calculated images potentially have some contribution from every slice in the original image data.

As should now be apparent, this inverse Fourier transform, phase shift, forward Fourier transform technique can be used for both oblique and curved reconstructions in accordance with the above description.

These as well as other objects and advantages of this invention will be more completely understood and appreciated by studying the following more detailed description of presently preferred exemplary embodiments of this invention in conjunction with the accompanying drawings of which:

Figure 1:
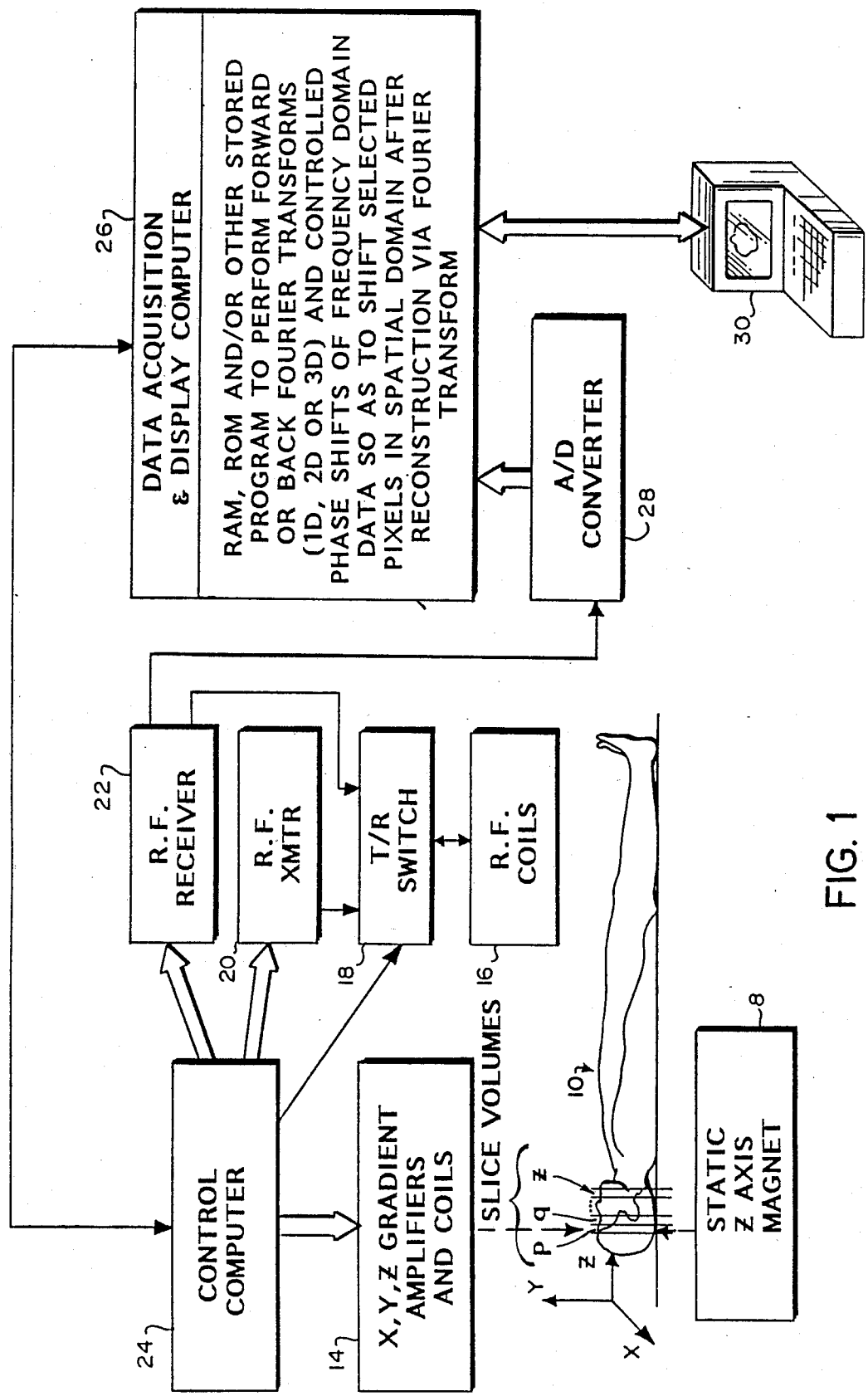
FIG. 1 is a schematic simplified representation of a typical magnetic resonance imaging system modified so as to practice this invention.
Figure 3A:
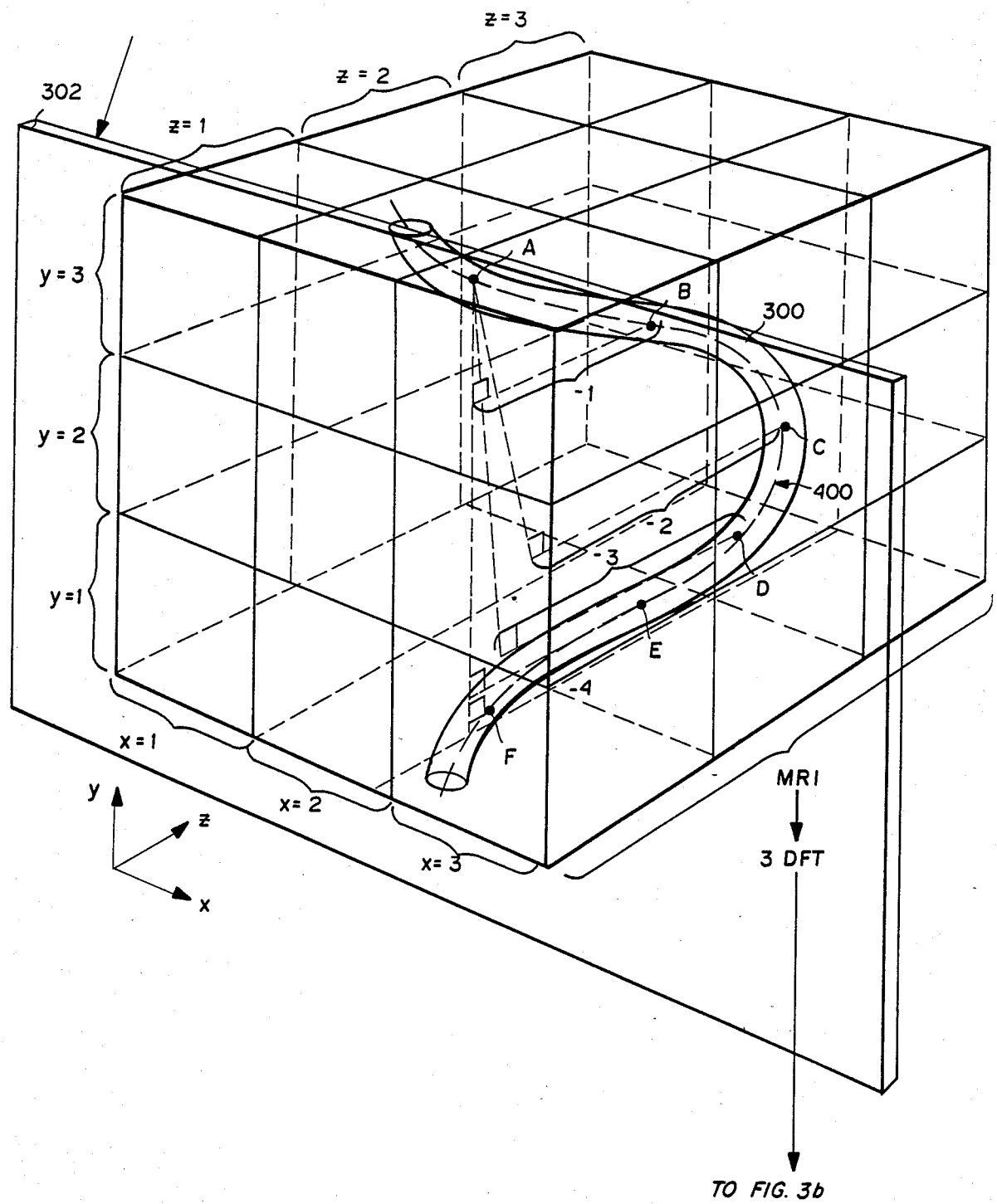
Figure 3B:
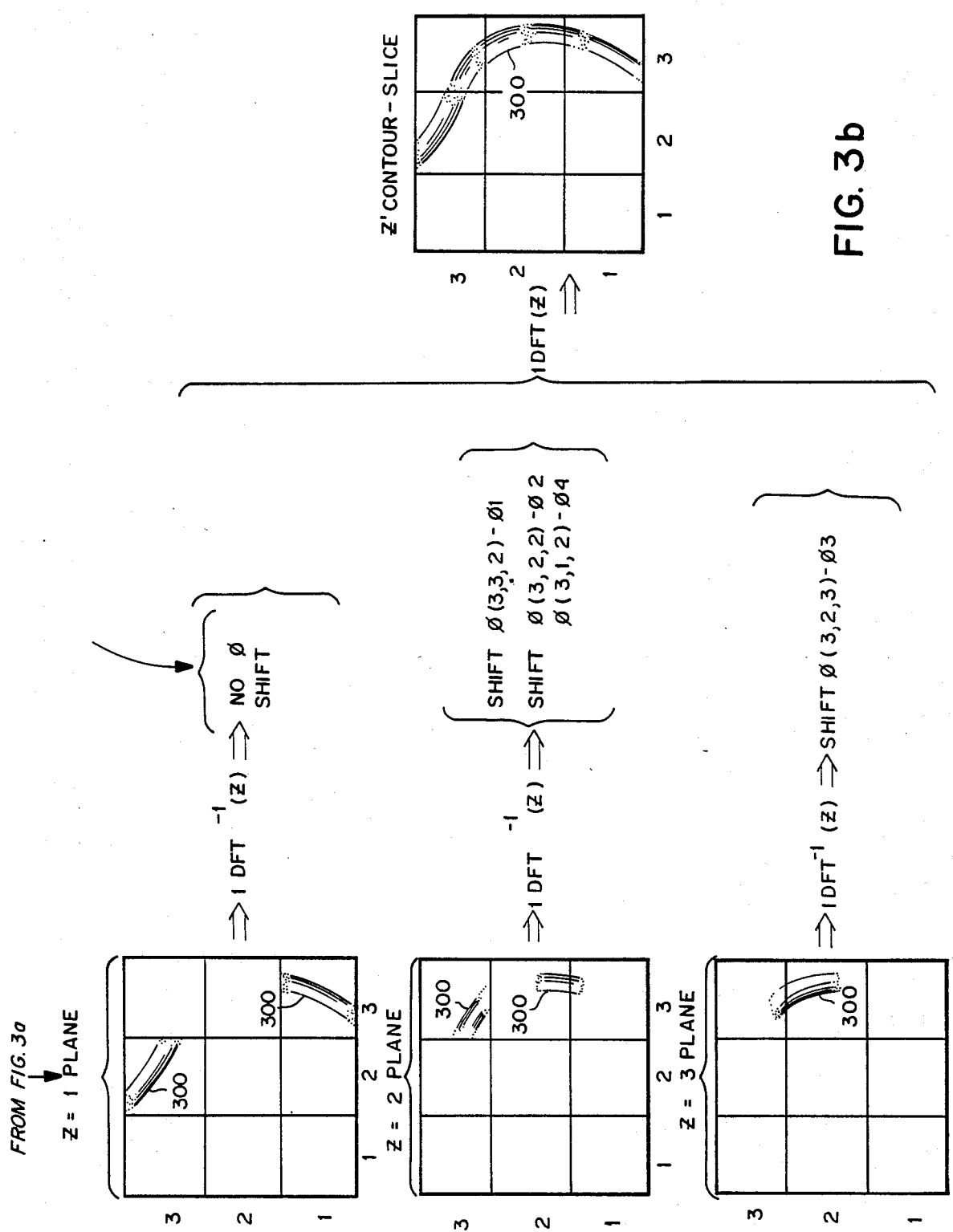
Figure 4:
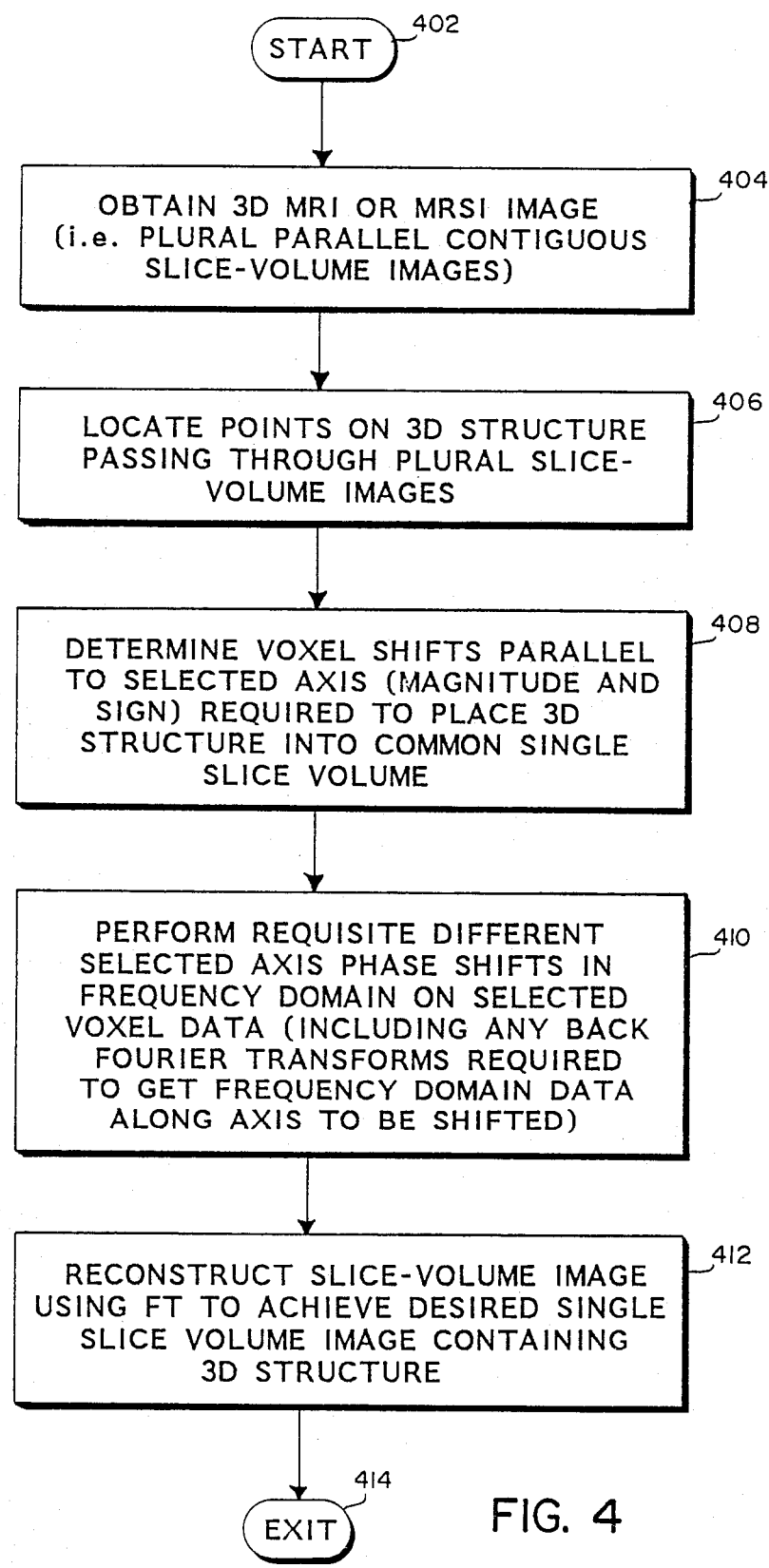

FIGS. 3A and 3B provide a simplified schematic depiction of a curved reconstruction in accordance with this invention; and FIG. 4 is a simplified flowchart of a suitable computer program which may be utilized in conjunction with the system of FIG. 1 so as to adapt it for achieving oblique or curved reconstructions using variable phase shifts in accordance with this invention.

The novel three-dimensional image processing procedure utilized by this invention typically can be achieved by suitable alteration of stored controlling computer programs in existing MRI apparatus. As an example of such typical apparatus, the block diagram of FIG. 1 depicts the general architecture of such a system.

Typically, a human or animal subject (or other object) 10 is placed within a static magnetic field. For example, the subject may lie along the z-axis of a static magnet 8 which establishes a substantially uniform magnetic field directed along the z-axis within the portion of the object 10 of interest. For example, contiguous parallel slice-volumes p,q . . . z may be located within the volume to be imaged. Gradients may be imposed within this z-axis directed magnetic field along mutually orthogonal x,y,z axes by a set of x,y,z gradient amplifiers and coils 14. NMR RF signals are transmitted into the body 10 and NMR RF responses are received from the body 10 via RF coils 16 connected by a conventional transmit/receive switch 18 to an RF transmitter 20 and RF receiver 22. As will be appreciated by those in the art, separate transmit and receive coils may be used in some installations in which case the T/R switch 18 may not be needed.

All of the prior mentioned elements may be controlled, for example, by a control computer 24 which communicates with a data acquisition and display computer 26. The latter computer 26 may also receive NMR responses via an analog-to-digital converter 28. A CRT display and keyboard unit 30 is typically also associated with the data acquisition and display computer 26.

As will be apparent to those in the art, such an arrangement may be utilized so as to generate desired sequences of magnetic gradient pulses and NMR RF pulses and to measure the desired NMR RF responses in accordance with stored computer programs. As depicted in FIG. 1, the NMR system of this invention will typically include RAM, ROM and/or other stored program media adapted (in accordance with the descriptions herein) so as to perform requisite forward or inverse Fourier transforms (in 1, 2 or 3 dimensions), to produce controlled variable phase shifts of frequency domain data followed by reconstruction of the phase shifted data using Fourier transforms so as to produce a reconstructed spatial domain image plane of structures passing within oblique or complexly curved paths through plural of the original image slice volumes.

Figure 2:
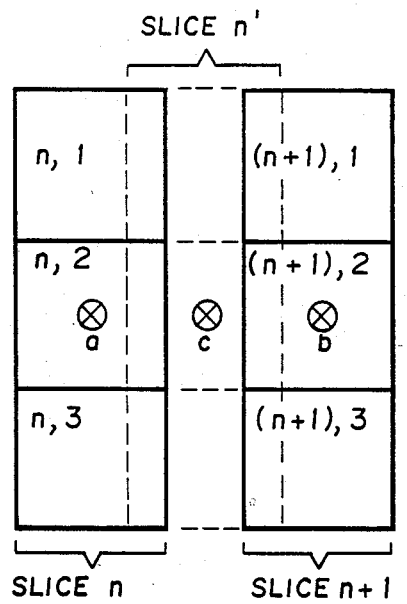
FIG. 2 is a schematic depiction of typical prior art spatial domain interpolation processes or rectilinear frequency domain phase shift processes.

FIG. 2 schematically depicts original image slice-volumes n and n+1 having an array of voxels n,1-3 and (n+1),1-3. In accordance with prior art procedures, the image of an intervening translated pseudo slice n' has been achieved either by interpolation in the spatial domain or by use of the Shift Theorem via phase shifts in the frequency domain followed by reconstruction. (The latter being utilized in the past to obtain rectilinear translational shifts such that the new slice-volume is parallel to original slice-volumes.) As depicted in FIG. 2, if the value of slice n' pixel C is determined as a function of pixel values A and B in slices n and n+1, then it necessarily follows that there is a loss of volume resolution:

$c = (a + b)/2$  loss of resolution (simple linear interpolation in spatial domain $c = \Sigma \frac{f(x,y,z)}{\text{all } x,y,z}$  no loss of resolution with phase shift in frequency domain to obtain rectilinear shifts in $x,y,z$ directions While there is no loss of volume resolution if the Shift Theorem is utilized in accordance with prior art teachings, one is still left with the new slice-volume n' being located only parallel to the original slice-volumes.

FIG. 3A depicts a simplified 3×3×3 image array of voxels organized along the usual orthogonal rectilinear x,y,z coordinates. Within this imaged volume, there is a three-dimensional structure 300 (e.g., a blood-vessel, portion of intestine, etc) which extends across plural slice-volumes of the image (e.g., a single slice-volume being all those x,y voxels within a constant z plane).

Using conventionally available spatial image processing software, it is possible to ascertain the x,y,z coordinates of selected voxels A,B . . . disposed nearest the general center line of curved structure 300.

Once those selected three-dimensional points have thus been defined within the 3D image volume, conventional three-dimensional polynomial fitting algorithms may be used so as to obtain a functional expression for a best fit polynomial curve 400 passing through those points. Alternatively, standard three-dimensional analytic geometry may be used to determine the necessary pixel shifts required so as to shift all of these points into a common plane 302 passing through the voxel centers of a common slice-volume of the original images (e.g., z=1), For example, as depicted in FIG. 3B, these required shifts are denoted in terms of their corresponding frequency domain phase shift $\phi 1, \phi 2, \phi 3 \ldots$.

FIG. 3B also depicts the individual three conventional slice-volumes (z=1,2,3) and the portions of structure 300 displayed within each. As depicted at 350, such slice-volume arrays of voxels may typically be achieved in magnetic resonance imaging using a three-dimensional Fourier transform process.

However obtained, an inverse Fourier transformation with respect to the z-axis dimension may be utilized so as to obtain partially collapsed image data where z-axis information resides in the frequency domain. The appropriate phase shifts are then used to adjust such frequency domain image data before it is utilized in a forward Fourier transformation process with respect to the z-axis dimension so as to produce a new common z' slice-volume displaying all of the imaged segments of structure 300 within a common display volume.

As will be appreciated, the same algorithm would be even less complex if applied to place a linear oblique structure within a common plane (i.e., so as to make the slice-volumes within the image volume lie at oblique angles with respect to the x,y,z coordinates). When a more complex curved shape such as structure 300 in FIG. 3 is processed as described, the resulting reconstructed z' slice contour does not necessarily represent a planar slice-volume in real space but, rather, may represent a complex convoluted image space "slice" or "contour" with finite thickness which nevertheless may be displayed on a planar two-dimensional screen.

If desired, the 3D image of FIG. 3a may be re-oriented with respect to any desired 3D rotation of the x,y,z coordinate system prior to calculating the required phase shifts. In this manner, the final "slice" volume may be oriented at any desired oblique angle with respect to the original x,y,z coordinate system.

For example, an arbitrary $\alpha$ rotation can be made about the original y axis to produce a new x', y', z' coordinate system. A further arbitrary rotation $\beta$ about the x' axis produces yet another x", y", z" coordinate system. And a still further arbitrary rotation $\epsilon$ about the z" axis produces an x''', y''', z''' coordinate system. Coordinate transformation from x,y,z to x''', y''', z''' can be shown to be:

$\begin{vmatrix} x''' \\ y''' \\ z''' \end{vmatrix} =$  [Equation 7]

-continued $$\left\| \begin{pmatrix} \cos\alpha\cos\epsilon \\ + \\ \sin\alpha\sin\beta\sin\epsilon \end{pmatrix} \quad \cos\alpha\sin\epsilon \quad \begin{pmatrix} \sin\alpha\cos\epsilon \\ + \\ \cos\alpha\sin\beta\sin\epsilon \end{pmatrix} \right\| \cdot \left\| \begin{matrix} x \\ y \\ z \end{matrix} \right\|$$

$$\begin{pmatrix} \sin\alpha\sin\beta\cos\epsilon \\ + \\ \cos\alpha\sin\epsilon \end{pmatrix} \quad \cos\beta\cos\epsilon \quad \begin{pmatrix} \cos\alpha\sin\beta\cos\epsilon \\ + \\ \sin\alpha\sin\epsilon \end{pmatrix}$$

$$\sin\alpha\cos\beta \quad \sin\beta \quad \cos\alpha\cos\beta$$

Here, for example, $$z''' = x \sin \alpha\cos \beta + y \sin \beta + z \cos \alpha\cos \beta \quad \text{[Equation 8]}$$

and the requisite further phase shift for such oblique orientation of the resulting slice or contour-volumes is simply $z''' - z'$.

If one applies the necessary further shift for all three axes, the resulting slices or contours are viewed along the $z'''$ axis. To further reduce the calculation burden, one may apply only the z-axis shifts. This results in a view perspective that is not perpendicular to the slice. However, it may have the advantage of being somewhat less disorienting to the viewer because the relative position of the viewer's eye to the object being viewed is preserved (only the apparent tilt of the "slice"-changes).

Exemplary phase shift equations for the variable phase shifting effected in use of this invention are:

If
$N_i$ = number of pixels in the i-axis
k = x index
l = y index
m = z index
Then:

$$f(x,y,z) = f(k,l,m) = \quad \text{[Equation 9]}$$

$$\sum_{klm} F_{klm} \exp\left[ 2\pi i \left( \frac{Kn}{N_x} + \frac{lp}{N_y} + \frac{mq}{N_z} \right) \right]$$

$$f(K,l,m + \delta) = \quad \text{[Equation 10]}$$

$$\sum_{klm} F_{klm} \exp\left[ 2\pi i \left( \frac{kn}{N_x} + \frac{lp}{N_y} + \frac{(m + \delta)q}{N_z} \right) \right]$$

$$= \sum_{klm} F'_{klm} \exp\left[ 2\pi i \left( \frac{Kn}{N_x} + \frac{lp}{N_y} + \frac{mq}{N_z} \right) \right] \quad \text{[Equation 11]}$$

where $$F'_{klm} = F_{klm} \exp\left( 2\pi i \frac{\delta q}{N_z} \right)$$

and $\delta = z - z_0$ $z = x\sin\alpha\cos\beta + y\sin\beta + z_0\cos\alpha\cos\beta$ $\delta$(small angle limit) $\approx x\sin\alpha + y\sin\beta$ FIG. 4 depicts one possible general organization of a computer program modification for the computer 26 in a typical MRI system so as to implement this invention. Here, after starting at 402 (or perhaps prior thereto), a three-dimensional image (e.g., MRI or MRSI) is conventionally obtained at 404. In this simplified exemplary embodiment, it is assumed to comprise plural parallel contiguous slice-volume images as depicted in FIG. 3A.

Then, at 406, points are located on a given three-dimensional structure passing through plural slice-volume images. Typically, these points might include, for example, the coordinates of the voxels located nearest the center of the selected structure within each slice-volume.

At 408, voxel shifts parallel to a selected axis (e.g., z-axis) are determined in both magnitude and sign as would be required so as to place the three-dimensional structure into a common single one of the slice-volumes. Then, at 410, the requisite differing phase shifts along that axis are performed using frequency domain data. If the original image has been obtained using a three-dimensional Fourier transform processes, then the already available actual data set as it already exists prior to one or more dimensions of Fourier transformation may itself be phase shifted. Alternatively, one or more dimensions of inverse Fourier transformation may be utilized so as to get the required frequency domain data along the axis (or axes) to be shifted.

Finally, at 412, all of the slice-volume images are reconstructed using one or more dimensions of forward Fourier transformation (as in conventional Fourier transform image construction) so as to achieve a desired single slice-volume image containing additional portions of the specified three-dimensional structure for viewing in a single two-dimensional CRT screen, film or other conventional visual display media. Return to other conventional programming may be made conventionally at 414 as will be understood by those in the art.

Since it is well-known that Fourier Transformation calculation processes in the frequency domain can also be effected by equivalent convolution calculation processes in the spatial domain, it will be understood that such equivalent spatial domain convolution processes are, for purposes of this invention and the following claims, to be considered within the definition of frequency domain transformation processes.

As to possible time savings, some real economy is achieved through using the inverse Fourier representation of the appropriate filter. However, this invention may include a further economy if shifts are performed only parallel to one axis.

While only a few exemplary embodiments of this invention have been described in detail, those skilled in the art will recognize that many variations and modifications may be made in these exemplary embodiments while yet retaining many of the novel features and advantages of this invention. Accordingly, all such variations and modifications are intended to be included within the scope of the appended claims.

What is claimed is:

1. A three-dimensional image processing method for reconstructing the image of a structure passing through plural slice-volumes of a three-dimensional image into a common single contour-volume so that a greater portion of the structure can be viewed simultaneously in a single planar image of a single contour-volume, said method comprising the steps of:

(a) determining, in the spatial domain within said three-dimensional image, varying voxel shifts along rays parallel to a predetermined axis required to place a selected imaged structure within a common image contour-volume, where the selected structure initially passes to varying extents within plural slice-volumes of the three-dimensional image;

(b) performing corresponding requisite variable phase-shifts on frequency domain data representing said three-dimensional image voxels along rays parallel to said predetermined axis, said phase shifts varying from one voxel to another as required by the varying extent to which said structure passes within the slice-volumes of the original image; and (c) transforming the thus variably phase-shifted frequency domain data to produce a new three-dimensional image having an increased portion of the structure within a single contour-volume thereof.

2. A method as in claim 1 wherein said predetermined axis is disposed perpendicular to plural parallel slice-volumes in the original three-dimensional image.

3. A method as in claim 1 wherein said structure is a linear structure extending at an oblique angle with respect to plural parallel slice-volumes in the original three-dimensional image thus making the requisite variable phase-shifts change as a linear function of two-dimensional voxel position within successive slice-volumes.

4. A method as in claim 1 wherein said structure is a curved structure extending along curved path with respect to plural parallel path slice-volumes in the original three-dimensional image thus making the requisite variable phase shifts change as a polynomial function of two-dimensional voxel position within successive slice-volumes.

5. A method as in claim 1, 2, 3 or 4 wherein step (b) includes performing at least one dimension of inverse Fourier Transformation so as to derive said frequency domain data.

6. A method as in claim 1, 2, 3 or 4 wherein step (b) uses data acquired and utilized via Fourier Transformation to create the original three-dimensional image as said frequency domain data to be variably phase-shifted and then re-transformed in step (c).

7. A three-dimensional image processing apparatus for reconstructing the image of a structure passing through plural slice-volumes of a three-dimensional image into a common single contour-volume so that a greater portion of the structure can be viewed simultaneously in a single planar image of a single contour-volume, said apparatus comprising:

(a) means for determining, in the spatial domain within said three-dimensional image, varying voxel shifts along rays parallel to a predetermined axis required to place a selected imaged structure within a common image contour-volume, where the selected structure initially passes to varying extents within plural slice-volumes of the three-dimensional image;

(b) means for performing corresponding requisite variable phase-shifts on frequency domain data representing said three-dimensional image voxels along rays parallel to said predetermined axis, said phase shifts varying from one voxel to another as required by the varying extent to which said structure passes within the slice-volumes of the original image; and (c) means for transforming the thus variably phase-shifted frequency domain data to produce a new three-dimensional image having an increased portion of the structure within a single contour-volume thereof.

8. Apparatus as in claim 7 wherein said predetermined axis is disposed perpendicular to plural parallel slice-volumes in the original three-dimensional image.

9. Apparatus as in claim 7 wherein said structure is a linear structure extending at an oblique angle with respect to plural parallel slice-volumes in the original three-dimensional image thus making the requisite variable phase-shifts change as a linear function of two-dimensional voxel position within successive slice-volumes.

10. Apparatus as in claim 7 wherein said structure is a curved structure extending along curved path with respect to plural parallel path slice-volumes in the original three-dimensional image thus making the requisite variable phase shifts change as a polynomial function of two-dimensional voxel position within successive slice-volumes.

11. Apparatus as in claim 7, 8, 9 or 10 wherein said means for performing includes means for performing at least one dimension of inverse Fourier Transformation so as to derive said frequency domain data.

12. Apparatus as in claim 7, 8, 9 or 10 wherein said means for performing includes means for using data acquired and utilized via Fourier Transformation to create the original three-dimensional image as said frequency domain data to be variably phase-shifted and then re-transformed by said means for transforming.

13. A three-dimensional image processing method for reconstructing the image of a structure passing through plural slice-volumes of a three-dimensional image into a common single contour-volume so that a greater portion of the structure can be viewed simultaneously in a single planar image of a single contour-volume, said method comprising the steps of:

(a) determining, in the spatial domain within said three-dimensional image, varying voxel shifts along rays parallel to a predetermined axis required to place a selected imaged structure within a common image contour-volume, where the selected structure initially passes to varying extents within plural slice-volumes of the three-dimensional image; and (b) performing convolution processes in the spatial domain to effect corresponding requisite variable phase-shifts representing said three-dimensional image voxels along rays parallel to said predetermined axis, said phase shifts varying from one voxel to another as required by the varying extent to which said structure passes within the slice-volumes of the original image so as to produce a new three-dimensional image having an increased portion of the structure within a single contour-volume thereof.

14. A method as in claim 13 wherein said predetermined axis is disposed perpendicular to plural parallel slice-volumes in the original three-dimensional image.

15. A method as in claim 13 wherein said structure is a linear structure extending at an oblique angle with respect to plural parallel slice-volumes in the original three-dimensional image thus making the requisite variable phase-shifts change as a linear function of two-dimensional voxel position within successive slice-volumes.

16. A method as in claim 13 wherein said structure is a curved structure extending along curved path with respect to plural parallel path slice-volumes in the original three-dimensional image thus making the requisite variable phase shifts change as a polynomial function of two-dimensional voxel position within successive slice-volumes.

17. A three-dimensional image processing apparatus for reconstructing the image of a structure passing through plural slice-volumes of a three-dimensional image into a common single contour-volume so that a greater portion of the structure can be viewed simultaneously in a single planar image of a single contour-volume, said apparatus comprising:
   (a) means for determining, in the spatial domain within said three-dimensional image, varying voxel shifts along rays parallel to a predetermined axis required to place a selected imaged structure within a common image contour-volume, where the selected structure initially passes to varying extents within plural slice-volumes of the three-dimensional image; and
   (b) means for performing convolution processes in the spatial domain to effect corresponding requisite variable phase-shifts representing said three-dimensional image voxels along rays parallel to said predetermined axis, said phase shifts varying from one voxel to another as required by the varying extent to which said structure passes within the slice-volumes of the original image so as to produce a new three-dimensional image having an increased portion of the structure within a single contour-volume thereof.

18. Apparatus as in claim 17 wherein said predetermined axis is disposed perpendicular to plural parallel slice-volumes in the original three-dimensional image.

19. Apparatus as in claim 17 wherein said structure is a linear structure extending at an oblique angle with respect to plural parallel slice-volumes in the original three-dimensional image thus making the requisite variable phase-shifts change as a linear function of two-dimensional voxel position within successive slice-volumes.

20. Apparatus as in claim 17 wherein said structure is a curved structure extending along curved path with respect to plural parallel path slice-volumes in the original three-dimensional image thus making the requisite variable phase shifts change as a polynomial function of two-dimensional voxel position within successive slice-volumes.

* * * * *

UNITED STATES PATENT AND TRADEMARK OFFICE
CERTIFICATE OF CORRECTION

PATENT NO. : 4,908,573

DATED : 13 March 1990

INVENTOR(S) : KAUFMAN et al

It is certified that error appears in the above-identified patent and that said Letters Patent is hereby corrected as shown below: ON TITLE PAGE:

IN THE ABSTRACT:
  Line 11, change "withing" to --within--.

Column 1, line 25, change "A" to --As--.
  Column 9, lines 40, 42 and 49, change "K" to --k--; and lines 49 and 55, change "F" to --F'--.

Signed and Sealed this

Twenty-second Day of October, 1991

Attest:

HARRY F. MANBECK, JR.

*Attesting Officer*         *Commissioner of Patents and Trademarks*